United States Patent [19]

Lapham et al.

[11] Patent Number: 5,759,902
[45] Date of Patent: *Jun. 2, 1998

[54] METHOD OF MAKING AN INTEGRATED CIRCUIT WITH COMPLEMENTARY JUNCTION-ISOLATED BIPOLAR TRANSISTORS

[75] Inventors: Jerome F. Lapham, Groton; Brad W. Scharf, Woburn, both of Mass.

[73] Assignee: Analog Devices, Incorporated, Norwood, Mass.

[*] Notice: The term of this patent shall not extend beyond the expiration date of Pat. No. 4,969,823.

[21] Appl. No.: 616,973

[22] Filed: Mar. 18, 1996

Related U.S. Application Data

[63] Continuation of Ser. No. 95,943, Jul. 22, 1993, abandoned, which is a continuation of Ser. No. 893,075, Jun. 1, 1992, abandoned, which is a division of Ser. No. 788,883, Nov. 7, 1991, abandoned, which is a division of Ser. No. 430,810, Nov. 1, 1989, Pat. No. 5,065,214, which is a division of Ser. No. 190,499, May 5, 1988, Pat. No. 4,969,823, which is a continuation of Ser. No. 912,771, Sep. 26, 1986, abandoned.

[51] Int. Cl.$^6$ ............................................. H01L 21/8228
[52] U.S. Cl. ........................... 438/322; 438/357; 438/358
[58] Field of Search ..................................... 438/322, 353, 438/356, 357, 358

[56] References Cited

U.S. PATENT DOCUMENTS 4,054,899  10/1977  Stehlin et al. .
4,058,419  11/1977  Tokumaru et al. .

FOREIGN PATENT DOCUMENTS 2053776  11/1970  Germany .

OTHER PUBLICATIONS

R.M. Warner, Jr., & J. N. Fordemwalt, "Integrated Circuits—Design Principles and Fabrication", Motorola Series in Solid–State Electronics, pp. 145–150.

Integrated Silicon Device Technology vol. XI., Bipolar Transistors, Research Triangle Institute Tec. Report ASD–TDR–63–316, vol. XI; Apr. 1966; pp. 218–261, 318.

*Primary Examiner*—Tuan H. Nguyen
*Attorney, Agent, or Firm*—Parmelee & Bollinger, LLP

[57] ABSTRACT

Process for making an integrated-circuit (IC) chip with junction-isolated complementary bipolar transistors, and novel chip made by such process. P-type dopant is implanted and diffused in an N-type substrate to form a sub-collector for a pnp transistor and also is implanted and diffused in the substrate to form a P-well for the sub-collector of an npn transistor. N-type material is then implanted and diffused into the P-well to form the npn sub-collector, and also is implanted in the substrate to form part of an isolation wall for the pnp transistor. A P-type epitaxial (epi) layer is grown over the N-type substrate. N-type material is implanted and diffused in the epi layer to complete the isolation wall for the pnp transistor, and to form the collector for the npn transistor. P-type and N-type material is implanted and diffused in the P-type epi layer to form the bases and emitters for the npn and pnp transistors.

17 Claims, 1 Drawing Sheet

METHOD OF MAKING AN INTEGRATED CIRCUIT WITH COMPLEMENTARY JUNCTION-ISOLATED BIPOLAR TRANSISTORS

This application is a continuation of Ser. No. 095,943 as filed on Jul. 22, 1993, now abandoned, which is a continuation of Ser. No. 893,075 as filed on Jun. 1, 1992, now abandoned, which is a division of Ser. No. 788,883 as filed on Nov. 7, 1991, now abandoned, which is a division of Ser. No. 430,810 filed on Nov. 1, 1989, now U. S. Pat. No. 5,065,214 which is a division of Ser. No. 190,499 as filed on May 5, 1988, now U.S. Pat. No. 4,969,823 which is a continuation of application Ser. No. 912,771 originally filed Sep. 26, 1986, now abandoned.

BACKGROUND OF THE INVENTION

1. Field of the Invention

This invention relates to monolithic integrated circuit (IC) devices. More particularly, this invention relates to improved IC devices having complementary junction-isolated bipolar transistors.

2. Description of the Prior Art

It has for many years been known to provide integrated circuits (ICs) having junction-isolated complementary transistors, i.e. both npn and pnp transistors. Circuits employing complementary transistors have important advantages, such as relatively low power consumption when used in push-pull configurations (where one transistor is off while the other is on). Advantageously, complementary ICs employ vertical npn and pnp structures which offer performance benefits. Typically, complementary ICs comprise a P-type substrate having an N-type epitaxial layer.

Known complementary IC devices have not been entirely satisfactory, particularly with respect to performance capabilities when used as amplifiers. Various proposals have been made from time to time in an effort to improve such devices, such as the use of more than one epitaxial layer, and other variations of the basic semiconductive structure. Nonetheless, modern day complementary junction-isolated ICs suffer still from important disabilities, and circuit designers have been seeking improved characteristics to permit them to use complementary ICs in more demanding applications.

One of the problems with presently known complementary ICs is that the relative performance capabilities of the two transistor types (npn and pnp) are not balanced. In one sense, this problem may be considered an inherent difficulty, since npn transistors are inherently better than pnp transistors. That is, the mobility of electrons, in npn transistors, is about 2.5 times higher than the mobility of holes, in pnp transistors. Nevertheless, achieving improved balance between the performance of npn and pnp transistors in a complementary IC (sometimes referred to as achieving improved "complementarity") can be very helpful to circuit designers in developing high-performance IC products. Indeed, some degradation of npn performance can be considered an acceptable trade-off for enhanced pnp performance, provided that both types of transistors have performance characteristics of suitably high level.

One characteristic of special importance to some circuit designers is the figure of merit $\beta \cdot V_A$. This figure represents the product of transistor current gain ("$\beta$"—equal to Ic/Ib) and "Early Voltage" ("$V_A$"—an extrapolated voltage intercept on a set of I-V curves). In conventional prior art complementary IC devices, the product $\beta \cdot V_A$ typically may be markedly different for the two different types of transistors. For many kinds of circuits, it is highly desirable that the two transistor types have more nearly equal $\beta \cdot V_A$ product. However, the product $\beta \cdot V_A$ should nevertheless be quite high for both types of transistors.

SUMMARY OF THE INVENTION

It has been determined that the Early Voltage $V_A$ is approximately proportional to $N_B/N_C$, where $N_B$ is the doping concentration of the transistor base and $N_C$ is the doping concentration of the transistor collector. $V_A$ thus can be increased by increasing $N_B$, or decreasing $N_C$. The current gain $\beta$ of a transistor is inversely proportional to $Q_B$, which is related to the concentration of dopant in the transistor base.

In a preferred embodiment of the invention, there is provided an improved monolithic integrated circuit with complementary junction-isolated bipolar transistors comprising an N-type substrate with a single epitaxial layer of P-type material. In a sequence of steps, the substrate is implanted with P-type and N-type dopant which is subsequently diffused (driven-in). After epitaxy is grown over the substrate, additional P-type and N-type material is implanted and diffused into the epitaxial layer, as will be described hereinbelow in detail. The end result is a complementary IC having importantly advantageous characteristics, especially high $\beta \cdot V_A$ product for both types of transistors, and also excellent gain-bandwidth product.

In a complementary bipolar process, either the npn or the pnp transrstor can have a diffused collector, i.e. a coll ector formed by diffusing one type of dopant (P or N) into a region which initially is of the other type. Such a diffused collector would be more heavily doped than the non-diffused collector. A higher Early Voltage for the pnp transistor may be obtained by having its collector more lightly doped than the collector of the npn transistor, thereby effecting better balance between the different type transistors. This is an important gain as a pnp has 3–5 times less base doping than an npn having the same beta, and is therefore at a 3–5 times disadvantage in Early Voltage. In accordance with one important aspect of the present invention, this result is achieved by forming the collector of the pnp transistor from a P-type epitaxial layer. Because this epitaxial layer need not be diffused (compensated) to P-type, it is more lightly doped than the collector of the npn transistor, and thus provides the desired enhancement of the pnp characteristics.

Other objects, aspects and advantages of the invention will in part be pointed out in, and in part apparent from, the following detailed description of a preferred embodiment of the invention, considered together with the accompanying drawings.

DETAILED DESCRIPTION OF A PREFERRED EMBODIMENT

Figure 1:
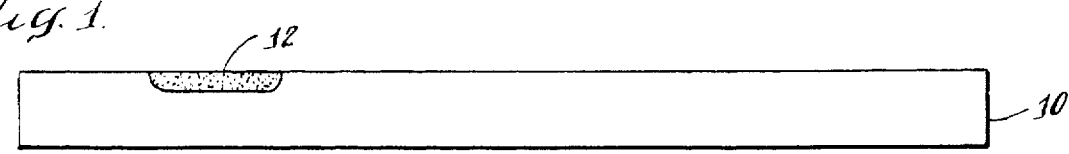
FIGS. 1 through 7 show dopant diffusion patterns in sequential views of a cross-section of an N-type substrate and a P-type epitaxial layer. P-type material is shown stippled. Interrupted lines are used in the drawings as a convention to indicate the merging of regions of the same conductivity type.

Referring now to FIG. 1, there is shown in section a portion 10 of a silicon substrate having N-type dopant, e.g. with a concentration of about $10^{15}$ atoms/cm$^3$. Starting with this substrate, the first principal step in the new complementary-bipolar (CB) process is to ion-implant a region 12 with boron to serve ultimately as a sub-collector for a pnp transistor to be formed. This implant (and others referred to hereinafter) is made in known fashion, as by opening an oxide layer to establish a window (e.g. rectangular in plan view) for the implant. The boron dose may be about $2.5 \times 10^{15}$ atoms/cm$^2$, formed with an implant energy of about 100 KeV. The implant 12 is thereafter driven-in (i.e. diffused down into the substrate at a temperature of about 1250° C. for a time period of about 60 minutes.

Figure 2:
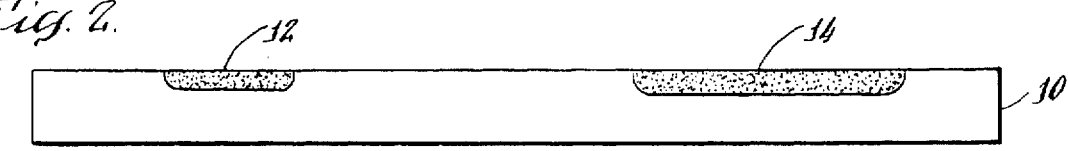

Referring now to FIG. 2, a second boron implant is made in the region indicated at 14 in the substrate,off-set laterally from the first implant region 12. This implant is to serve ultimately as a P-well to isolate the to-be-formed sub-collector of an npn transistor. The dose of the implant in the region 14 may be about $8 \times 10^{13}$ atoms/cm.$^2$, made at an implant energy of about 100 KeV. This second implant is driven-in at a temperature of about 1250° C., for a time period of about 30 minutes.

Figure 3:

Referring now to FIG. 3, N-type implants next are made in the region indicated at 16 and 18. Implant region 16 is to develop part of an isolation wall surrounding the pnp transistor when it is completed, and may for example define a closed rectangular configuration, as seen in plan view, surrounding the diffused implant region 12. The other N-type implant region 18 is formed within the previously made diffused P-type implant 14, and also may have a rectangular configuration. Both N-type implants may be phosphorous having a dose of about $10^{15}$ atoms/cm.$^2$ implanted with an energy of about 100 KeV. These N-type implants are driven-in at a temperature of about 1250° C. for a time period of 30 minutes, so that they diffuse down into the substrate 10.

Figure 4:
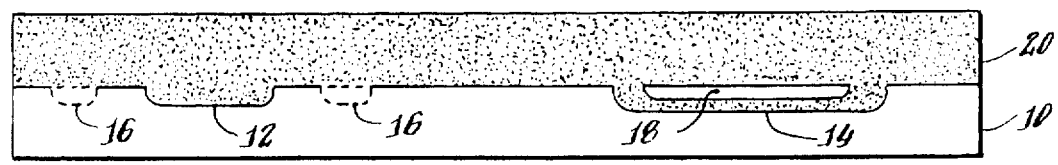

The next principal step in the process is to grow P-type epitaxy to form a layer 20 over the N-type substrate 10, as shown in FIG. 4. This epitaxial layer may for example be 15.5 microns thick, with boron at a concentration of about $10^{15}$ atoms/cm$^3$.

Figure 5:
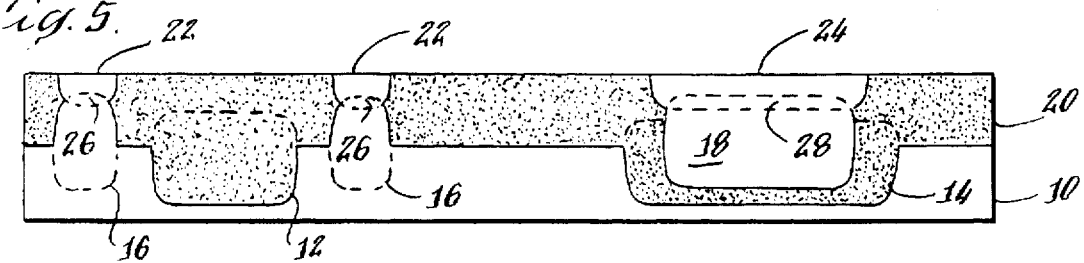

Referring now to FIG. 5, phosphorous (N-type) implants are made in the regions indicated at 22 and 24 in the epitaxial layer 20. These implants may have a dose of about $2.3 \times 10^{12}$ atoms/cm.$^2$, at an implant energy of 150 KeV.

The implant region 22 is immediately above the N-type implant region 16 previously formed in the substrate 10 (see FIG. 3). The other N-type implant region 24 is directly over the other N-type region 18 previously formed in the substrate 10 (FIG. 3). The implants 22 and 24 are driven-in at a temperature of about 1250° C. for a time period of about 250 minutes, and diffuse downwardly into the epitaxial layer. While this downward diffusion is taking place, the previous implants 16 and 18 diffuse upwardly into the epitaxial layer, merging with the diffused implants 22 and 24 in central regions indicated by the interrupted cross-over lines 26 and 28. The merged N diffusions 16 and 22 complete the isolation wall around the region for the pnp transistor. The merged N diffusions 18 and 24 define the collector region for the npn transistor being formed.

As described above, during drive-in the substrate implants 16 and 18 diffuse upwardly in the processing illustrated in FIG. 5, while the epitaxial layer implants 22 and 24 diffuse downwardly during that processing. Thus, implants such as made in regions 16 and 18 often are referred to as "up" regions, while implants such as made in regions 22 and 24 often are referred to as "down" regions.

During this drive-in step, the substrate implants in regions 12, 14,16 and 18 also diffuse, downwardly, deeper into the substrate 10, as indicated in FIG. 5.

Figure 6:
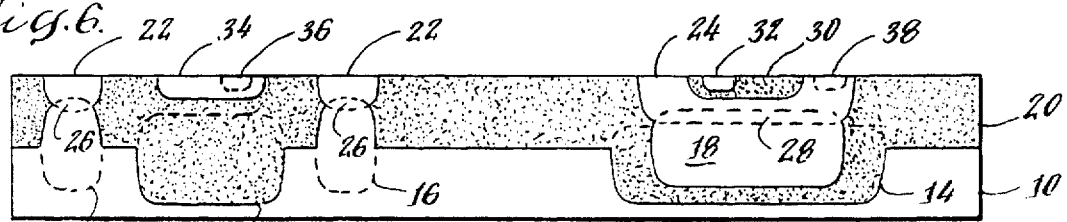

Turning now to FIG. 6, implants are next made into regions indicated at 30, 32, 34, 36 and 38 of the epitaxial layer 20. The implant at region 30 is of P-type material (e.g. boron) to serve as the base for the npn transistor. N-type material (e.g. arsenic) is implanted in region 32 within the P-type npn base region 30, to serve as the emitter of the npn transistor. Another N-type implant (e.g. phosphorus) is made in a region indicated at 34 to serve as the base for the pnp transistor The boron implant at region 30 may have a dose of $3 \times 10^{14}$ atoms/cm.$^2$, implanted with an energy of 100 KeV. The arsenic implant at region 32 may have a dose of $8 \times 10^{15}$ atoms/cm.$^2$, with an implant energy of 100 KeV. The phosphorus implant at region 34 may have a dose of $2.0 \times 10^{14}$ atoms/cm.$^2$, with an implant energy of 100 KeV.

Implants corresponding to the npn emitter implant in region 32 are made simultaneously in the regions indicated at 36 and 38. The first of these emitter implants in region 36 serves as a "base contact diffusion" to enhance the contact-forming properties within the pnp base region 34. The other emitter implant in region 38 serves as a collector contact diffusion for the npn collector.

The implants in regions 30–38 then are driven in at a temperature of about 1100° C. for a time period of about 120 minutes.

Figure 7:
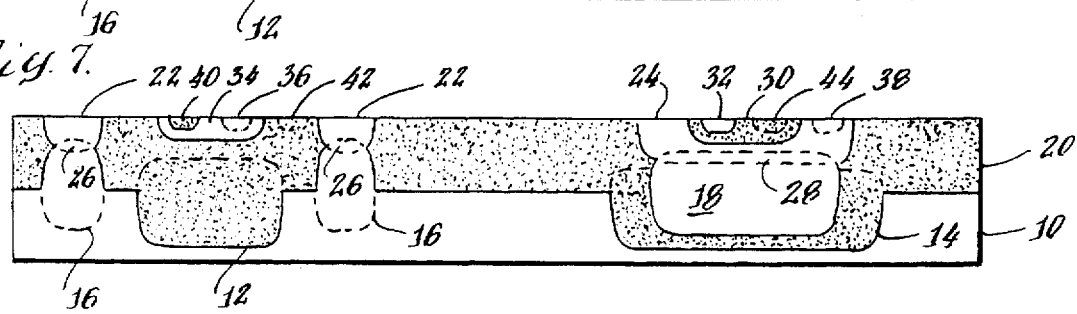

Referring now to FIG. 7, boron next is implanted in the region indicated at 40 to form the emitter for the pnp transistor. This implant may be at a dose of $6.5 \times 10^{15}$ atoms/cm.$^2$, with an implant energy of 100 KeV. Corresponding implants are made in the regions indicated at 42 and 44 to enhance the contact-making properties for the pnp collector and the npn base. The boron implants are then driven-in at a temperature of about 1000° C. for a time period of about 60 minutes to complete formation of the basic complementary IC structure in accordance with the invention.

Further conventional processing will of course be necessary to complete fabrication of the final product, including formation of other circuit elements such as resistors, formation of contacts and metallization as required. Novel devices manufactured by the new process described above have superior characteristics for widely different applications.

Although a specific preferred embodiment of the inventive IC structure and processing thereof have been described above in detail, it is to be understood that this is exemplary only, and not to be interpreted as limiting. Those skilled in this art may make many variations of the disclosed techniques and arrangements to suit particular applications without departing from the scope of this invention. For example, in many instances the sequences of procedural steps set forth above can be altered while still carrying out the basic concepts of the invention. Predeposit diffusions may be substituted for the implantation steps in many cases. Also, changes in processing conditions such as drive-in temperatures and time periods, can be made in accordance with known technology. Still other changes can be made as appropriate to meet different requirements.

What is claimed is:

1. The method of making an integrated circuit with complementary bipolar transistors comprising the following steps (not necessarily in the order recited):

introducing P-type material in an N-type substrate to form a sub-collector for a pnp transistor and to form a P-well for isolating the collector of an npn transistor;

introducing N-type material in said substrate to form up regions to (a) partially establish said npn collector in said P-well and (b) partially establish an isolation wall for said pnp transistor;

growing a P-type epitaxial (epi) layer over said N-type substrate;

introducing N-type material into said epi layer to form down regions to (1) merge with said N-type collector up region and (2) merge with said N-type isolation up region to form said isolation wall;

said N-type down region merging with said N-type collector up region having a net dopant concentration exceeding that of said P-type epi layer;

introducing P-type material in said epi layer to form a base for said npn transistor;

introducing N-type material in said epi layer to form an emitter for said npn transistor;

introducing N-type material in said epi layer to form a base for said pnp transistor; and introducing P-type material in said epi layer to form an emitter for said pnp transistor.

2. The method of making an integrated circuit with complementary bipolar transistors comprising the following steps (not necessarily in the order recited):

introducing P-type impurity in an N-type substrate to form a sub-collector for a pnp transistor;

growing a P-type epitaxial (epi) layer over said N-type substrate;

introducing N-type material in said P-type epi layer to form a collector region for an npn transistor;

introducing N-type material in said P-type epi layer to establish an N-type isolation wall surrounding a portion of said P-type epi layer which is above said P-type impurity in said substrate, said surrounded portion of said P-type epi layer serving as a lightly-doped collector region for said pnp transistor so as to provide a high Early Voltage for that transistor;

said non collector region having a net dopant concentration exceeding that of said P-type epi layer;

introducing at least one impurity in said epi layer to form a base region for at least one of said transistors;

introducing N-type material in said epi layer to form an emitter region for said npn transistor; and introducing P-type material in said epi layer to form an emitter region for said pnp transistor.

3. The method of claim 2, including the steps of introducing P-type and N-type impurities to form the bases for both of said transistors respectively.

4. The method of making an integrated circuit with complementary bipolar transistors comprising the following steps (not necessarily in the order recited):

introducing in a substrate having N-type dopant with a concentration of about $10^{15}$ atoms/cm$^3$ a P-type impurity at a dose level of about $2.5 \times 10^{15}$ atoms/cm$^3$ to form a sub-collector for a pnp transistor;

growing over said substrate a P-type epitaxial (epi) layer having a dopant concentration of about $10^{15}$ atoms/cm$^3$;

introducing N-type material in said P-type epi layer to form a collector region for an npn transistor;

said N-type material in said P-type epi layer providing a net concentration exceeding that of said P-type epi layer; and introducing N-type material in said P-type epi layer to establish an N-type isolation wall surrounding a portion of said P-type epi layer which is above said P-type impurity in said substrate, said surrounded portion of said P-type epi layer serving in said pnp transistor as a collector region with the epi dopant concentration of $10^{15}$ atoms/cm$^3$ so as to provide a high Early Voltage for that transistor.

5. The method of claim 4, wherein said N-type collector region is formed with dopant at a dose level of about $2.3 \times 10^{12}$ atoms/cm$^2$.

6. The method of making an integrated circuit with complementary bipolar transistors comprising the following steps (not necessarily in the order recited):

introducing P-type impurity in an N-type substrate to form a sub-collector for a pnp transistor;

growing a P-type epitaxial (epi) layer over said N-type substrate;

introducing N-type material in said P-type epi layer to form a collector region for an npn transistor, said N-type collector region having a dopant concentration higher than the concentration of dopant in said epi layer serving as the collector of said pnp transistor;

introducing N-type material in said P-type epi layer to establish an N-type isolation wall surrounding a portion of said P-type epi layer which is above said P-type impurity in said substrate, said surrounded portion of said P-type epi layer serving as a lightly-doped collector region for said pnp transistor so as to provide a high Early Voltage for that transistor;

introducing at least one impurity in said epi layer to form a base region for at least one of said transistors;

introducing N-type material in said epi layer to form an emitter region for said npn transistor; and introducing P-type material in said epi layer to form an emitter region for said pnp transistor.

7. The method of making an integrated circuit with complementary bipolar transistors comprising the following steps (not necessarily in the order recited):

introducing in a substrate a P-type impurity dose of about $2.5 \times 10^{15}$ atoms/cm$^2$;

growing a P-type epitaxial (epi) layer over said substrate, said epitaxial layer having a dopant concentration of about $10^{15}$ atoms/cm$^3$;

introducing N-type material in said epi layer to form a collector region for an npn transistor;

said N-type material in said epi layer providing a net concentration exceeding that of said P-type epi layer;

establishing in said P-type epi layer an isolation barrier surrounding a portion of said P-type epi layer so that said portion can serve as a collector region of a pnp transistor;

introducing P-type material in said epi layer to form a base region for said npn transistor;

introducing N-type material in said epi layer to form an emitter region for said npn transistor;

introducing N-type material in said epi layer to form a base region for said pnp transistor; and introducing P-type material in said epi layer to form an emitter region for said pnp transistor.

8. The method of claim 7, wherein said N-type collector region is formed with dopant at a dose level of about $2.3 \times 10^{12}$ atoms/cm$^2$.

9. The method of making an integrated circuit (IC) with two vertical, electrically isolated, complementary bipolar transistors comprising the following steps (not necessarily in the order recited):

forming a well of P conductivity type in a silicon substrate of N conductivity type;

forming a sub-collector region of N conductivity type contained entirely within said well;

forming in said substrate, outside of said well, a sub-collector region of P conductivity type;

forming a collector of N conductivity type over the sub-collector of N conductivity type to provide a continuous doped region from the IC surface to the sub-collector of N conductivity type;

forming a collector of P conductivity type over the sub-collector of P conductivity type to provide a continuous doped region from the IC surface to the sub-collector of P conductivity type, with at least a portion of the doped region having less concentration of dopant than the corresponding region of said collector of N conductivity type;

forming a base region of N conductivity type wholly contained within said collector of P conductivity type;

forming an emitter region of P conductivity type wholly contained within said base region of N conductivity type;

forming a base region of P conductivity type wholly contained within said collector region of N conductivity type;

forming an emitter region of N conductivity type wholly contained within said base region of P conductivity type;

electrically isolating said transistors from each other; and providing means for ohmically contacting said transistors.

10. The method of claim 9, wherein the electrical isolation of the two transistors is effected by junction isolation.

11. The method of claim 9, wherein said P-type collector is developed by P-type epitaxy; and said N-type collector is developed by converting P-type epitaxy to N-type.

12. The method of claim 11, wherein said N-type collector is diffused to merge with the N-type sub-collector.

13. The method of claim 12, wherein the PNP transistor is isolated from the NPN transistor by a ring of merged N-type dopant and a corresponding ring of N-type surface doping.

14. The method of making an integrated circuit with complementary bipolar transistors comprising the following steps (not necessarily in the order recited):

implanting P-type material in an N-type substrate to form a sub-collector for a pnp transistor and to form a P-well for isolating the collector of an npn transistor;

implanting N-type material in said P-well substrate to partially establish a collector in said P-well for said npn transistor;

implanting N-type material in said substrate to form up regions to partially establish an isolation wall for said pnp transistor;

growing a P-type epitaxial (epi) layer over said N-type substrate;

implanting N-type material into said epi layer to form a down region to merge with said partially established N-type collector;

implanting N-type material into said epi layer to form a down region to merge with said N-type isolation up regions to form said isolation wall;

implanting P-type material in said epi layer to form a base for said npn transistor;

implanting N-type material in said epi layer to form an emitter for said npn transistor;

implanting N-type material in said epi layer to form a base for said pnp transistor; and implanting P-type material in said epi layer to form an emitter for said pnp transistors;

said collector for said non transistor having a net dopant concentration exceeding that of said P-type epi layer.

15. The method of claim 14 wherein said substrate has an N-dopant concentration of about $10^{15}$ atoms/cm$^3$ and said epitaxial layer has a P-dopant concentration of about $10^{15}$ atoms/cm$^3$;

said sub-collector having a P-dopant-concentration of about $2.5 \times 10^{15}$ atoms/cm$^3$; and said N-type material implanted in said epi layer to merge with said N-type collector being formed with dopant at a dose level of about $2.3 \times 10^{12}$ atoms/cm$^2$.

16. The method of making an integrated circuit with complementary bipolar transistors comprising the following steps (not necessarily in the order recited):

providing a substrate with P-type material to form a sub-collector for a pnp transistor;

growing an epitaxial (epi) layer over said substrate;

arranging a part of said epi layer to serve as a P-type pnp collector;

introducing N-type material into said epi layer to form an N-type collector for the npn transistor;

said N-type collector having a net dopant concentration exceeding that of said P-type collector;

arranging said epi layer to provide P-type material forming a base for said npn transistor;

introducing N-type material in said epi layer to form an emitter for said npn transistor;

introducing N-type material in said epi layer to form a base for said pnp transistor; and introducing P-type material in said epi layer to form an emitter for said pnp transistor.

17. The method of claim 16, wherein said npn base is formed by introducing P-type material into said epi layer.

* * * * *